US009214605B2

(12) United States Patent
Tanaka

(10) Patent No.: US 9,214,605 B2
(45) Date of Patent: Dec. 15, 2015

(54) NITRIDE SEMICONDUCTOR LIGHT EMITTING DEVICE

(71) Applicant: KABUSHIKI KAISHA TOSHIBA, Tokyo (JP)

(72) Inventor: Akira Tanaka, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 13 days.

(21) Appl. No.: 14/016,182

(22) Filed: Sep. 2, 2013

(65) Prior Publication Data

US 2014/0284638 A1   Sep. 25, 2014

(30) Foreign Application Priority Data

Mar. 22, 2013   (JP) .................................. 2013-061123

(51) Int. Cl.

| | | |
|---|---|---|
| *H01L 33/00* | (2010.01) | |
| *H01L 33/36* | (2010.01) | |
| *H01L 33/20* | (2010.01) | |
| *H01L 33/50* | (2010.01) | |
| *H01L 33/38* | (2010.01) | |
| *H01L 33/32* | (2010.01) | |
| H01L 33/22 | (2010.01) | |
| H01L 33/42 | (2010.01) | |
| H01L 33/44 | (2010.01) | |

(52) U.S. Cl.
CPC .............. *H01L 33/382* (2013.01); *H01L 33/32* (2013.01); *H01L 33/0079* (2013.01); *H01L 33/22* (2013.01); *H01L 33/38* (2013.01); *H01L 33/42* (2013.01); *H01L 33/44* (2013.01)

(58) Field of Classification Search
CPC .................................................. H01L 33/382
See application file for complete search history.

(56) References Cited

U.S. PATENT DOCUMENTS

| 8,120,046 B2 | 2/2012 | Iizuka et al. |
| 8,138,506 B2 | 3/2012 | Uemura et al. |
| 8,436,373 B2 * | 5/2013 | Mizutani et al. ................ 257/88 |

(Continued)

FOREIGN PATENT DOCUMENTS

| JP | H10-321907 A | 12/1998 |
| JP | 2006-210491 A | 8/2006 |

(Continued)

OTHER PUBLICATIONS

Japanese Office Action with English translation, Patent Application No. JP 2013-061123, dispatch dated Apr. 22, 2015.

*Primary Examiner* — Victor A Mandala
*Assistant Examiner* — Regan J Rundio
(74) *Attorney, Agent, or Firm* — Patterson & Sheridan, LLP

(57) ABSTRACT

A nitride semiconductor light emitting device includes a laminate, first and second electrodes, a conductive layer, and a phosphor layer. The laminate includes a first layer including a first electroconductive-type layer, a second layer including a second electroconductive-type layer, a light emitting layer between the first and second layers, and a nitride semiconductor. The laminate has a recessed portion extending from the first layer to the second layer in a central portion or an outer peripheral portion. The first electrode arranged on the first layer reflects light emitted from the light emitting layer. The second electrode is surrounded by the light emitting layer or on the periphery thereof and connected to a bottom surface of the recessed portion. The conductive layer is arranged on a surface of the second layer at a side opposite to the light emitting layer. The phosphor layer overlies the second layer and the conductive layer.

18 Claims, 20 Drawing Sheets

(56) References Cited

U.S. PATENT DOCUMENTS

| | | |
|---|---|---|
| 8,450,762 B2 * | 5/2013 | Jeong ................ 257/98 |
| 2004/0012013 A1 | 1/2004 | Katayama |
| 2005/0224833 A1 * | 10/2005 | Fudeta ............ 257/103 |
| 2007/0058059 A1 * | 3/2007 | Suehiro ............ 348/294 |
| 2007/0085089 A1 * | 4/2007 | Hsu .................. 257/81 |
| 2007/0145379 A1 * | 6/2007 | Eliashevich et al. ........... 257/79 |
| 2009/0127568 A1 * | 5/2009 | Kinoshita et al. ............. 257/79 |
| 2010/0117114 A1 | 5/2010 | Suzuki et al. |
| 2010/0219436 A1 | 9/2010 | Watanabe |
| 2010/0237381 A1 * | 9/2010 | Kamiya ............ 257/99 |
| 2011/0204395 A1 * | 8/2011 | Hong et al. ............ 257/94 |
| 2012/0146086 A1 | 6/2012 | Yokobayashi et al. |
| 2014/0070714 A1 * | 3/2014 | Lee et al. ............ 315/186 |
| 2014/0339581 A1 * | 11/2014 | Kwon et al. ............ 257/94 |

FOREIGN PATENT DOCUMENTS

| | | |
|---|---|---|
| JP | 2007-027539 A | 2/2007 |
| JP | 2007-073789 A | 3/2007 |
| JP | 2009059969 A | 3/2009 |
| JP | 2010-092957 A | 4/2010 |
| JP | 2011-071272 A | 4/2011 |
| JP | 2011-071339 A | 4/2011 |
| JP | 2011-187958 A | 9/2011 |
| JP | 2011-216524 A | 10/2011 |
| JP | 2012-124330 A | 6/2012 |
| JP | 2013-030817 A | 2/2013 |
| WO | 2010/074288 A1 | 7/2010 |

* cited by examiner

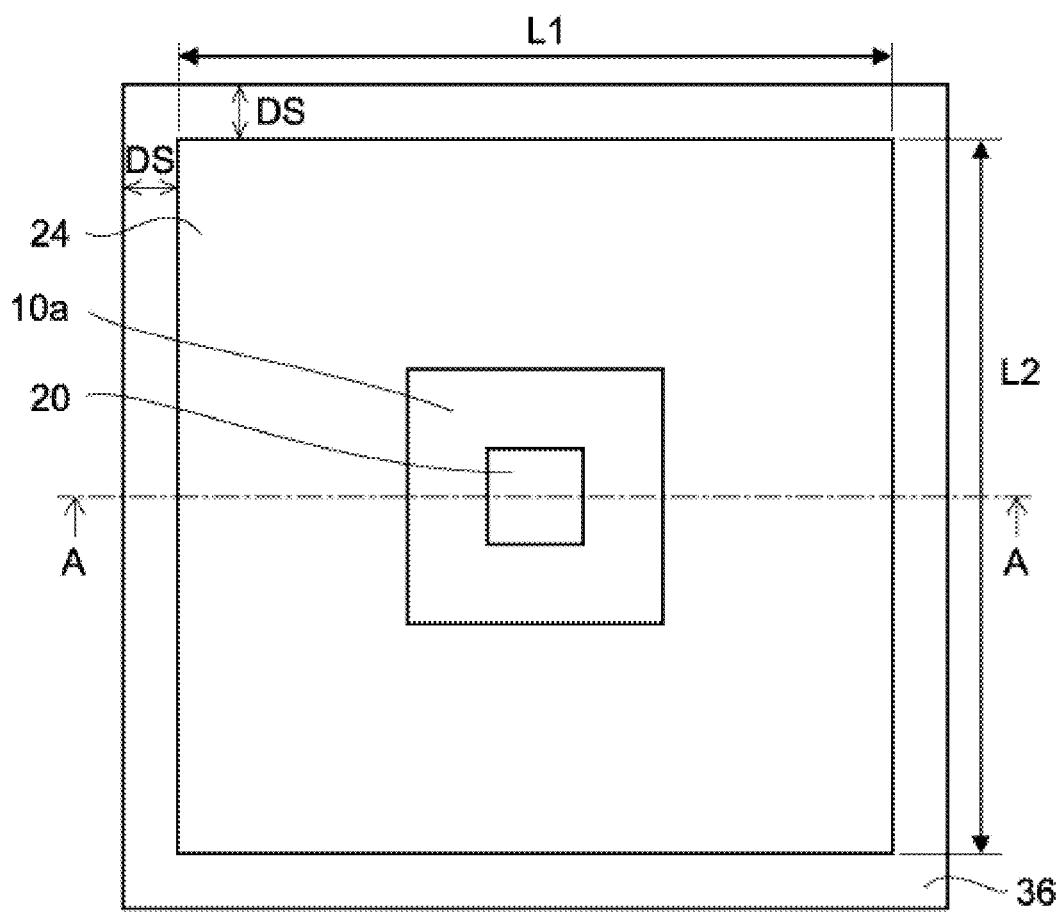

NITRIDE SEMICONDUCTOR LIGHT EMITTING DEVICE

CROSS-REFERENCE TO RELATED APPLICATION

This application is based upon and claims the benefit of priority from Japanese Patent Application P2013-061123, filed Mar. 22, 2013; the entire contents of which are incorporated herein by reference.

FIELD

Embodiment described herein relates generally to a nitride semiconductor light emitting device.

BACKGROUND

Nitride semiconductor light emitting devices are widely used as illuminating devices, display devices, traffic lights, and the like.

In these applications, there is a high demand for a semiconductor light emitting device with lower operation voltage and a higher optical output.

In the nitride semiconductor light emitting device, usually, on one surface where a recessed portion is arranged for a semiconductor laminate, a p-side electrode and an n-side electrode are arranged, and the other surface is the light output surface.

As carriers are concentrated and injected to the narrow region of the light emitting layer near the n-side electrode and the p-side electrode, the Auger electron recombination and carrier overflow increase. As a result, the light emitting efficiency decreases, a high light output cannot be realized, and the operation voltage also becomes higher.

DESCRIPTION OF THE DRAWINGS

FIG. 4A is a schematic diagram illustrating the lower surface of a nitride semiconductor light emitting device in a third embodiment.

DETAILED DESCRIPTION

Figure 1A:
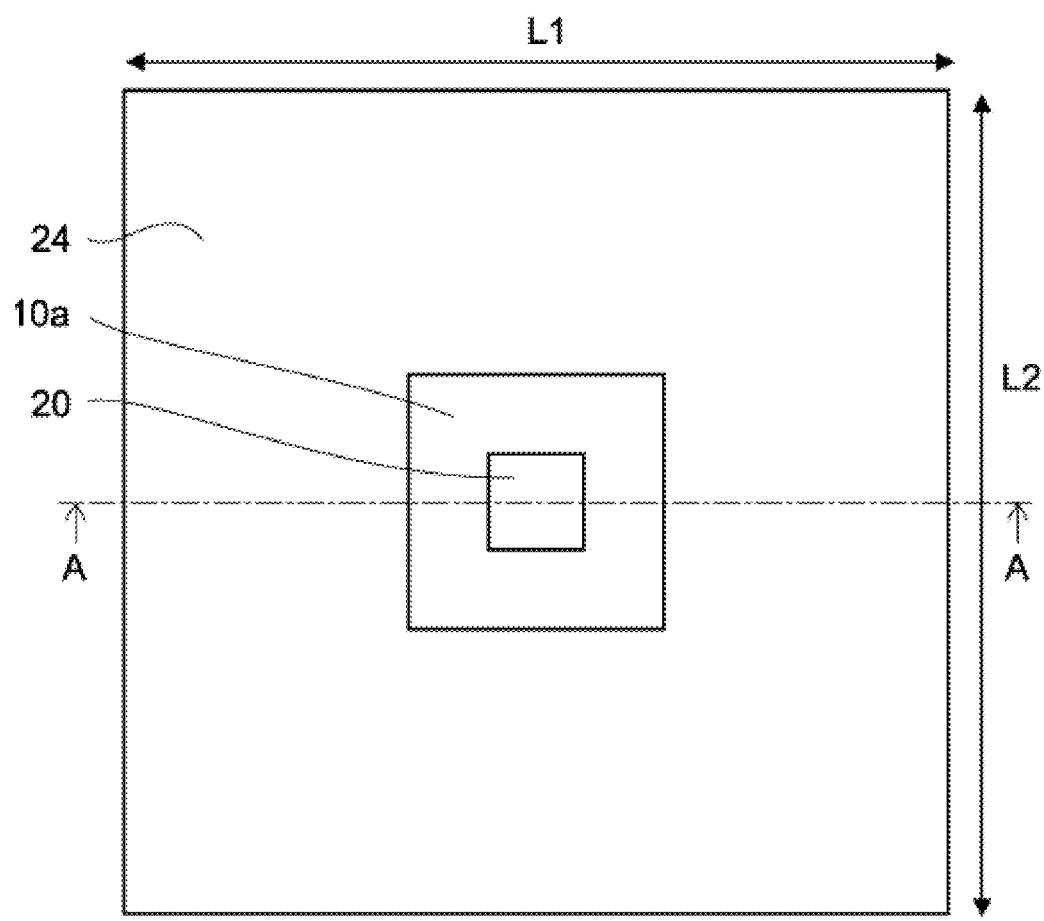
FIG. 1A is a schematic diagram illustrating the lower surface of a nitride semiconductor light emitting device in a first embodiment.

According to one embodiment, a nitride semiconductor light emitting device includes a laminate, a first electrode, a second electrode, a conductive layer, and a phosphor layer. The laminate includes a first layer including a first electroconductive-type layer, a second layer including a second electroconductive-type layer, and a light emitting layer arranged between the first layer and the second layer and formed of a nitride semiconductor material, such as GaN. The laminate is provided with a recessed portion extending from a surface of the first layer to the second layer in at least any of a central portion and an outer peripheral portion of the laminate. The first electrode is arranged on the surface of the first layer and reflects light emitted from the light emitting layer. The second electrode is surrounded by the light emitting layer or is located at the periphery of the light emitting layer, and is connected to a bottom surface of the recessed portion. The conductive layer is arranged on a surface of the second layer at a side opposite to the light emitting layer. A phosphor layer covers a region on the surface of the second layer which the conductive layer does not cover.

In general, according to one embodiment, with reference to the drawing figures, the present disclosure will be explained in detail.

Figure 1B:
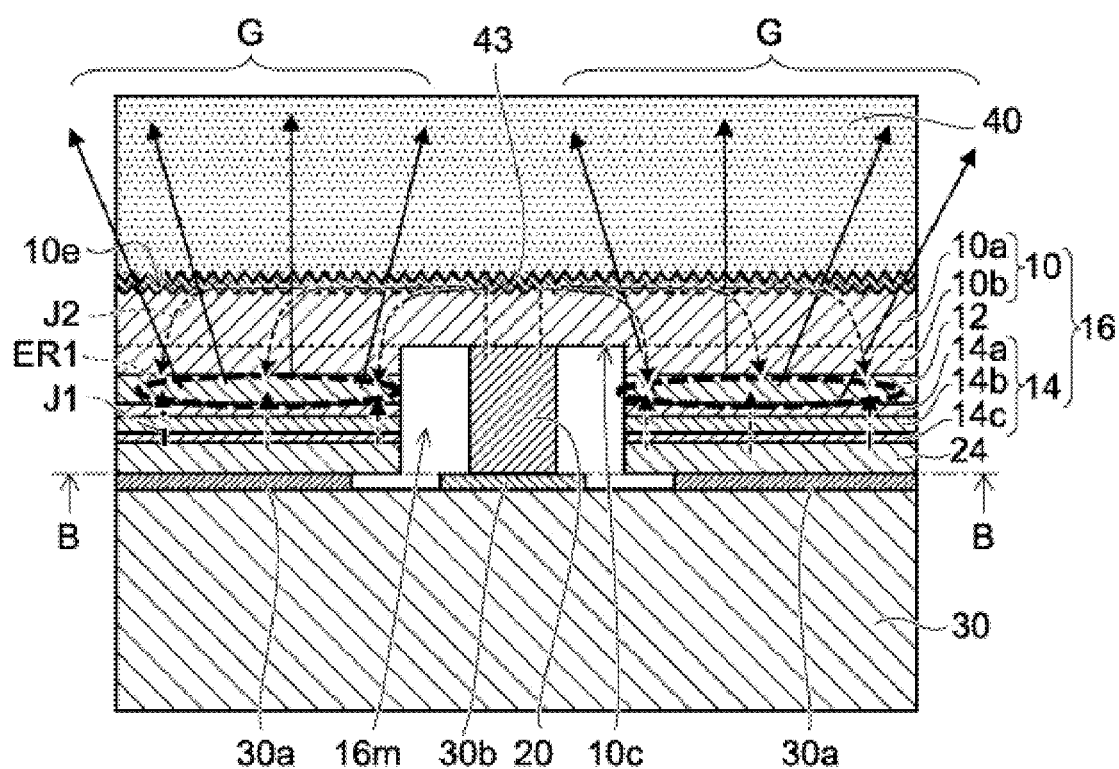
FIG. 1B is a schematic cross-sectional view of FIG. 1A taken along A-A.

FIG. 1A is a schematic diagram illustrating the lower surface of a nitride semiconductor light emitting device in a first embodiment, and FIG. 1B is a schematic cross-sectional view of FIG. 1A taken along A-A.

Here, FIG. 1A is a schematic diagram illustrating a lower surface along B-B in FIG. 1B. Here, the nitride semiconductor light emitting device includes a laminate 16, a first electrode 24, a second electrode 20, a conductive layer 42, and a phosphor layer 40.

The laminate 16 includes a first layer 14 including a first electroconductive-type layer, a second layer 10 including a second electroconductive-type layer, and a light emitting layer 12 arranged between the first layer 14 and the second layer 10, and are formed of a nitride semiconductor. In the central portion of the laminate 16, a recessed portion 16m is formed which extends from the surface of the first layer 14 to a portion of the second layer 10. The recessed portion 16m includes an inner wall 16w and a base surface 10c.

The first electrode 24 is arranged on the surface of the first layer 14, and the first electrode also functions to reflect light emitted from the light emitting layer 12 in a direction away from the phosphor layer back in the direction of the phosphor layer. By incorporating silver (Ag) at least into the portion of the first electrode 24 facing the layer, it is possible to increase the light reflectivity of the first electrode 24. In addition, the second electrode 20 is connected to the base surface 10c of the recessed portion 16m, and it is surrounded by the light emitting layer 12, the first layer 14 and the first electrode 24.

The conductive layer 42 is arranged on the surface 10e of the second layer 10 which is the side opposite to the light emitting layer 12 of the recessed portion 16m. According to the first embodiment, the conductive layer 42 is made of a transparent electroconductive film 43, such as ITO (indium tin oxide), zinc oxide, and/or tin oxide, and it is arranged to almost fully cover the surface 10e of the second layer 10. The thickness of the transparent electroconductive film 43 may be about 0.17 μm or the like.

During operation, carriers J1 injected from the first electrode 24 are fed to the light emitting layer 12. On the other hand, carriers J2 injected from the second electrode 20 are spread outwardly from the recessed portion 16m in or along the transparent electroconductive film 43 and are then fed to the light emitting layer 12. Consequently, as shown in FIG. 1B, in the light emitting layer 12, the portion beneath the transparent electroconductive film 43 becomes a light emitting region ER1, and a portion of the emitted light is emitted upwardly (in the direction of the phosphor layer 40). Another portion of the emitted light is emitted downwardly, and it is reflected by the adjacent surface of the first electrode 24 to travel upwardly in the direction of the phosphor layer 40.

In addition, the phosphor layer 40 absorbs at least a portion of the light emitted from the light emitting layer 12, and the phosphor layer then emits light at a wavelength longer than (or different than) that of the emitted light. The phosphor layer 40 may be formed by coating YAG (yttrium aluminum garnet) phosphor grains or the like mixed into a transparent resin liquid onto the conductive layer 42, followed by thermal curing or the like. As a result, above the phosphor layer 40, white light or the like can be obtained as the mixed light G of the emitted wavelength light and the wavelength converted light. For the nitride semiconductor light emitting device, it is possible to have one edge length L1 of 0.5 mm and the other edge length L2 of 0.5 mm, referring back to FIG. 1.

The nitride semiconductor light emitting device may also have a supporting body 30. The supporting body 30 may include a third electrode 30a and a fourth electrode 30b. The first electrode 24 on the surface of the laminate 16 and the third electrode 30a on the supporting body 30 may be bonded together, and the second electrode 20 and the fourth electrode 30b on the supporting body 30 likewise bonded, to form an LED structure on an underlying wafer. After the bonding to the wafer, the underlying crystal growth substrate on which the laminate was grown may be removed. One may also adopt a scheme in which a reinforcing resin or the like is filled in between the first electrode 24 and the second electrode 20 to ensure the mechanical strength of the electrodes, so that the supporting body 30 need not be provided.

In the following, the structure of the laminate 16 will be explained in more detail. In the following explanation, the first layer 14 includes a p-type layer, and the second layer 10 includes an n-type layer. However, the present disclosure is not limited to such electroconductive type configuration.

The laminate 16 is formed by crystal growth on a sapphire, silicon, or another substrate using an MOCVD (metal organic chemical vapor deposition) method or the like. The laminate 16 includes the first layer 14, the second layer 10, and the light emitting layer 12 arranged between the first layer 14 and the second layer 10.

The second layer 10 forms a base layer from which the light emitting layer 12 and the first layer extend, and may include an n-type GaN clad layer 10a (donor concentration of $1 \times 10^{19}$ $cm^{-3}$ and a thickness of 4 μm) and a super lattice layer 10b (30 pairs of 1 nm-thick well layer and 3 nm-thick barrier layer) comprising InGaN/InGaN. The super lattice layer 10b may also be an undoped layer. By arranging the super lattice layer 10b, it is possible to improve the crystallinity of the nitride semiconductor that is prone to lattice mismatch, i.e., to reduce defects in the desired single crystal structure. The light emitting layer 12 may be an InGaN/InGaN undoped MQW layer (4.5 pairs of a 5 nm-thick well layers and a 5 nm-thick barrier layers).

The first layer 14 may include a p-type AlGaN overflow inhibiting layer 14a (with acceptor concentration of $1 \times 10^{20}$ $cm^{-3}$ and a thickness of 5 nm), a p-type clad layer 14b (with acceptor concentration of $1 \times 10^{20}$ $cm^{-3}$ and a thickness of 100 nm), a p-type contact layer 14c (with acceptor concentration of $1 \times 10^{21}$ cm-3 and a thickness of 5 nm), etc.

The laminate 16 includes a concave recessed portion 16m extending inwardly of the laminate from the surface of the first layer 14 and ending at a base surface 10c at the portion of the second layer 10 in the central portion of the laminate. The base surface 10c of the recessed portion 16m may be formed to extend into the n-type GaN clad layer 10a. The second electrode 20 is arranged on, and extends from, the base surface 10c of the recessed portion 16m. The second electrode 20 is surrounded with the light emitting layer 12 and the first electrode 24.

Also, the second layer 10 may be thinned to a prescribed thickness by etching the surface 10e on the side thereof opposite to the light emitting layer 12. It is preferred that an unevenness or pattern be formed or left on the surface 10e after etching as this can increase the light output efficiency of the resulting LED device. As the phosphor layer 40 is coated on the surface 10e with the unevenness formed thereon, it is possible to form the unevenness on both surfaces of the phosphor layer 40.

According to the first embodiment, by arranging the transparent electroconductive film 43 on the surface 10e of the second layer 10, it is possible to spread the carriers injected from the second electrode 20 over a wide spread or distance of the light emitting layer 12 from the second electrode 20. On the other hand, because the first electrode 24 is positioned to cover the light emitting layer 12 over, or nearly over, its entire width and the distance from the second electrode to the light emitting layer 12 is also short, it is easy to spread the carriers from the first electrode 24 out over the surface of the light emitting layer 12. Consequently, it is possible to maintain a low Auger (non-light-emitting) recombination probability and a low carrier overflow, and to have high light emitting efficiency. Auger recombination probability increases as the electron concentration and the hole concentration are higher. As a result, by spreading the carriers over the entire first surface of the light emitting layer by use of the conductive layer 42, it is possible to suppress decrease in the light emitting efficiency in the high current operation, and it is possible to further increase the light output.

When the second electrode 20 is taken as the n-side (n-doped) electrode, the electrons, which have a higher mobility than holes, can be spread over a wide span or distance of the light emitting layer 12. On the other hand, as the first electrode 24 (the p-side electrode) is arranged to cover most or all of the surface of the light emitting layer 12 and the distance to the light emitting layer 12 from the first electrode 24 is also short, it is easy to spread the holes, which have a lower mobility than the electrons, over the entire surface of the light emitting layer 12 adjacent to or facing the first electrode. Consequently, it is possible to further increase the light emitting efficiency of the LED. As a result, it is also possible to further increase light output during high current operation.

Figure 2A:
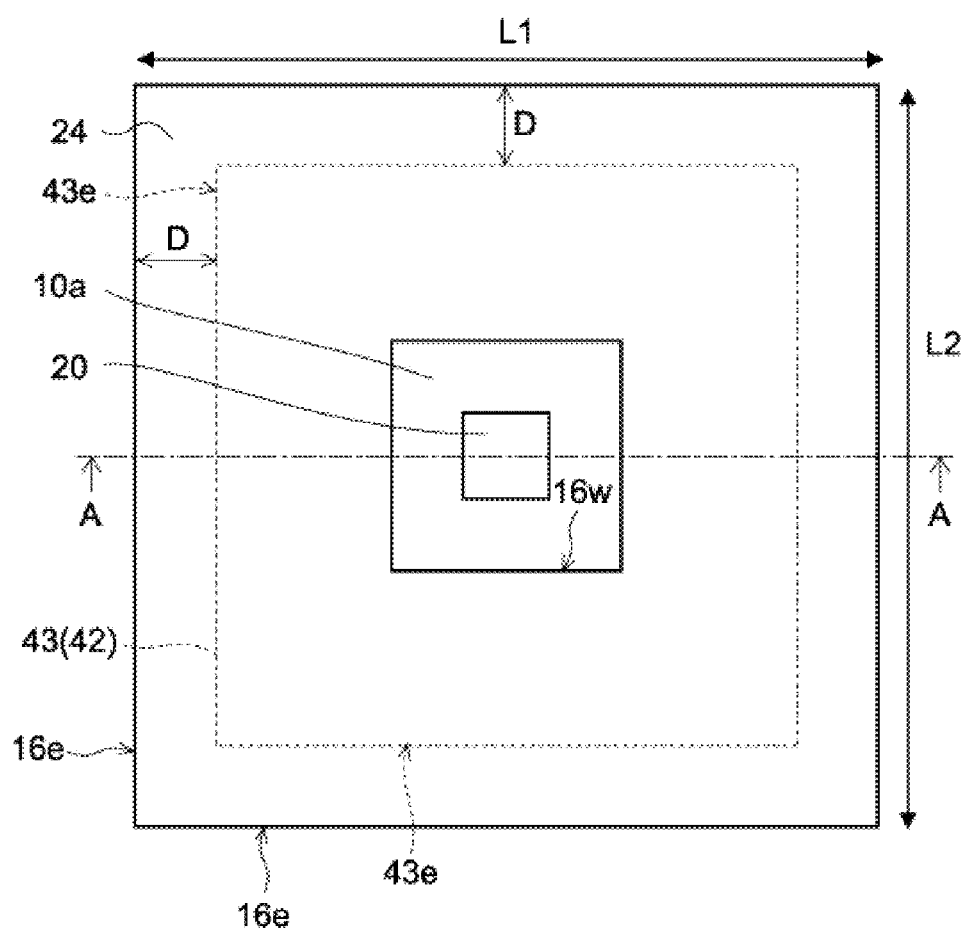
FIG. 2A is a schematic diagram illustrating the lower surface of a nitride semiconductor light emitting device in a second embodiment.
Figure 2B:
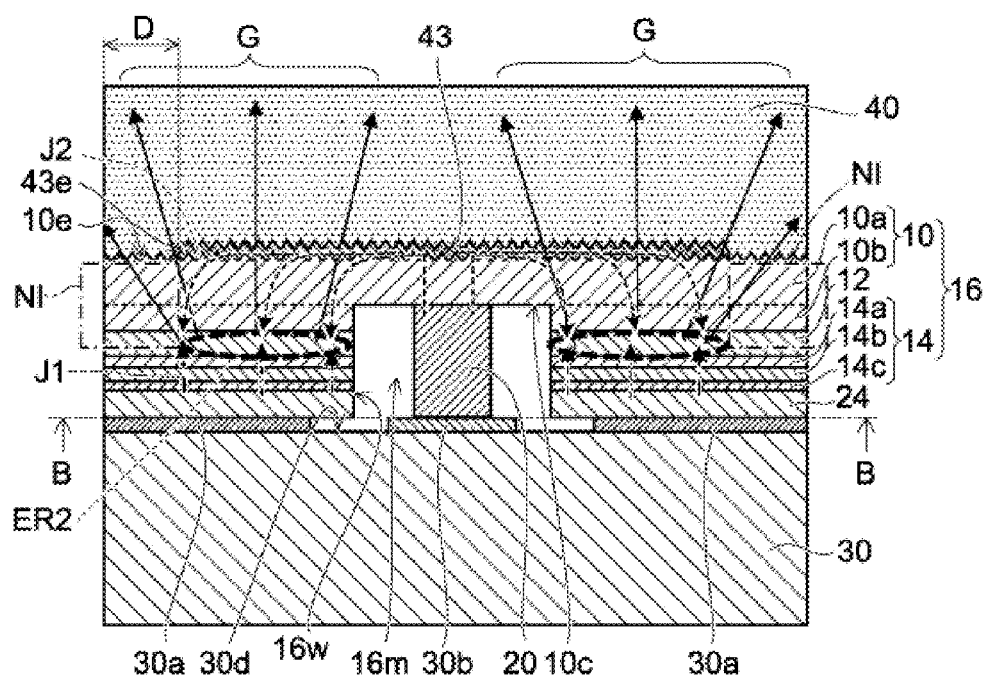
FIG. 2B is a schematic cross-sectional view of FIG. 2A taken along A-A.

FIG. 2A is a schematic diagram illustrating the lower surface of the nitride semiconductor light emitting device related to the second embodiment, and FIG. 2B is a schematic cross-sectional view of FIG. 2A taken along section A-A.

Here, FIG. 2A is a schematic diagram illustrating the lower surface along B-B in FIG. 2B. Here, the nitride semiconductor light emitting device includes a laminate 16, a first electrode 24, a second electrode 20, a conductive layer 42, and a phosphor layer 40.

The phosphor layer 40 is arranged on the surface of the transparent electroconductive film 43 and on the surface 10e of the second layer 10, in a region of the surface 10e which is free of the transparent electroconductive film 43. The phosphor layer absorbs the light emitted from the light emitting layer 12, and the phosphor layer then emits the wavelength converted light with a wavelength longer than (or different than) that of the emitted light.

As shown in FIG. 2B, adjacent to the end 43e of the transparent electroconductive film 43, which is located at a distance D from the side 16e (FIG. 2A) of the laminate 16, the peripheral portion of the light emitting layer 12 becomes a low injection region NI, and a light emitting region ER2 formed terminates inwardly of the side 16e as compared to the light emitting region ER1 in the first embodiment. Consequently, it is possible to decrease the intensity of the light emitted from the side surface 16e of the laminate 16. For example, it is possible to decrease the blue light that is emitted from the side surface 16e of the laminate 16 which does not pass into to the phosphor layer 40, and it is thereby possible to suppress the color unevenness that would take place otherwise when the blue color light escapes from the peripheral portion of the LED. The color unevenness can be determined by measuring the chromaticity and the color temperature of the LED.

Figure 3A:
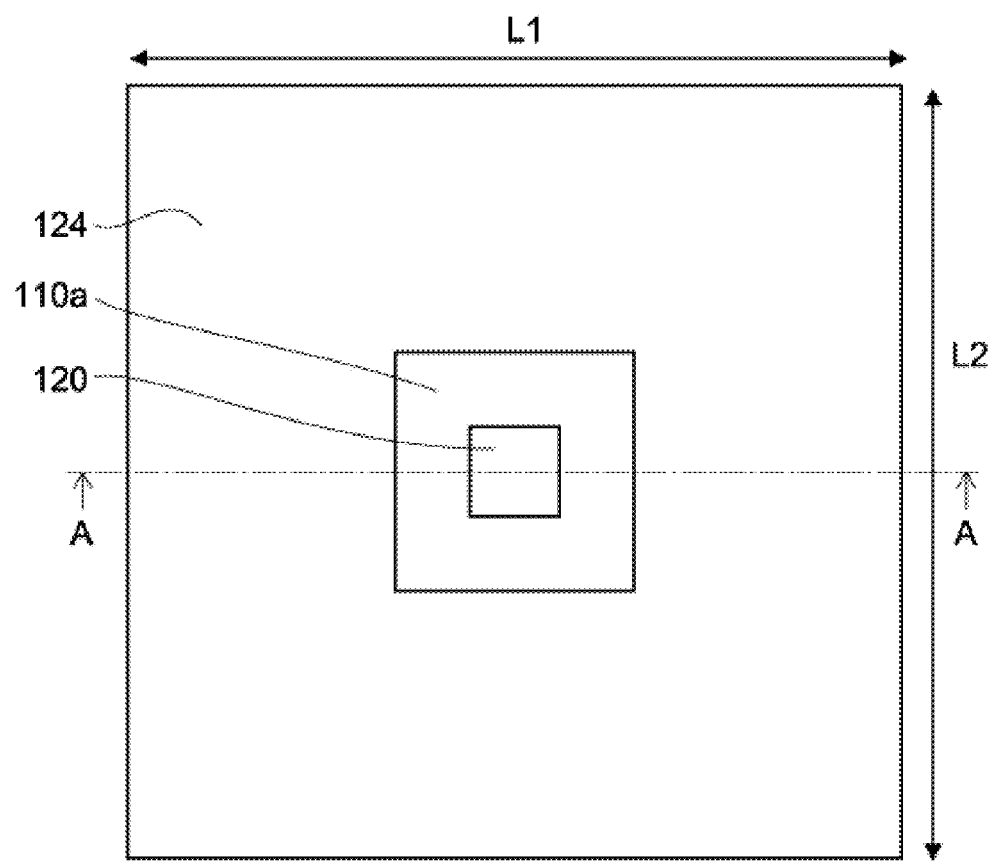
FIG. 3A is a schematic diagram illustrating the lower surface of a nitride semiconductor light emitting device in a comparative example.
Figure 3B:
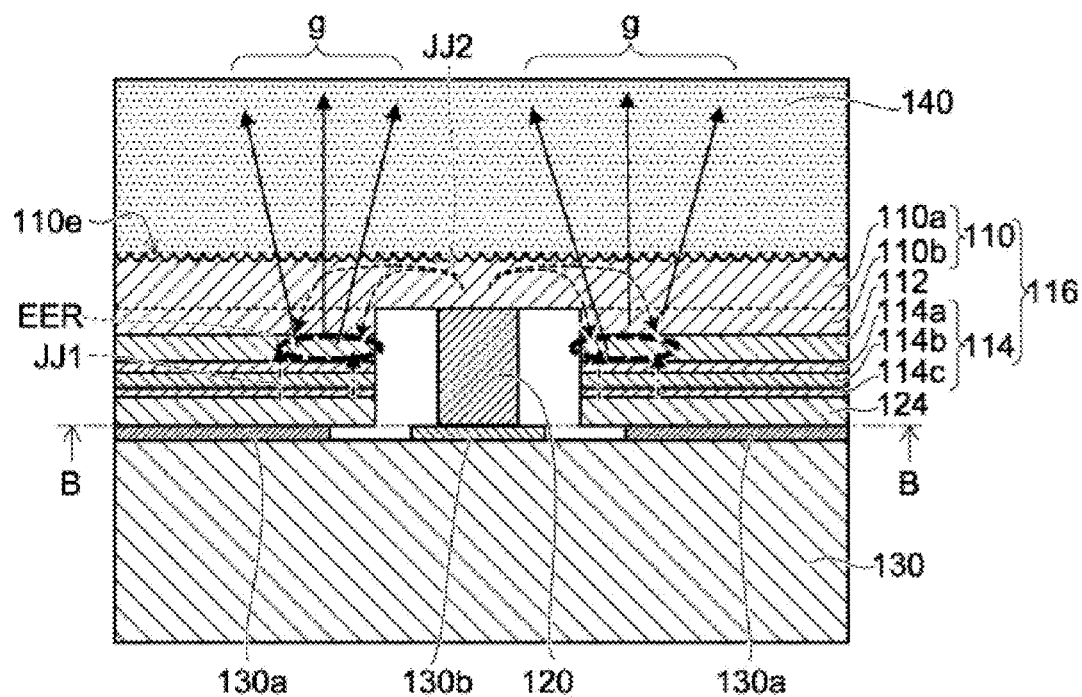
FIG. 3B is a schematic cross-sectional view of FIG. 3A taken along A-A.

FIG. 3A is a schematic diagram illustrating the lower surface of the nitride semiconductor light emitting device in a comparative example, and FIG. 3B is a schematic cross-sectional view of FIG. 3A taken along section A-A.

Here, FIG. 3A is a schematic diagram illustrating the lower surface along B-B. In the LED structure shown, the transparent electroconductive film is not located between the second layer 110 of the laminate 116 and the phosphor layer 140. The electroconductivity of the n-type GaN clad layer 110a is lower than that of the transparent electroconductive film of the n-type GaN clad layer 110a. Electrons JJ2 injected from the second electrode 120 into the n-type GaN clad layer 110a flow into the light emitting layer 112 of the second electrode 120, but do not significantly travel to and reach light emitting layer 112 adjacent to the outer peripheral portion of the laminate 116.

Consequently, the current is concentrated in the region near the second electrode 120, and the light emitting region EER becomes narrower. As the current density is increased, the Auger recombination probability increases drastically, and carrier overflow also increases, so that the proportion of the increase of spontaneous light emitting recombination probability becomes saturated, and the light emitting efficiency decreases.

Figure 4B:
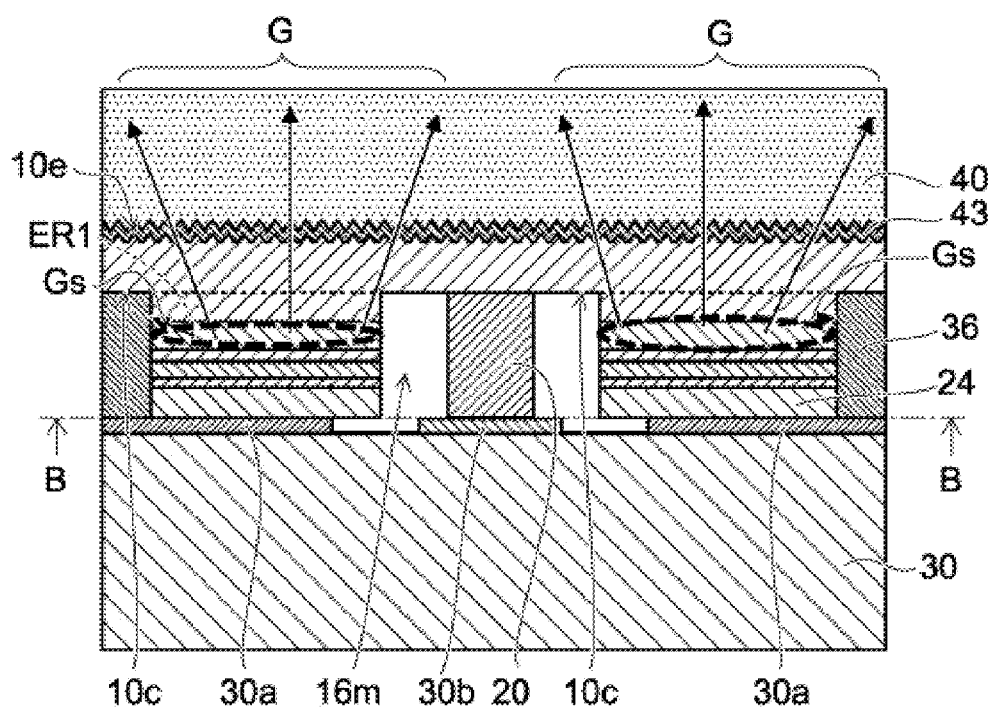
FIG. 4B is a schematic cross-sectional view of FIG. 4A taken along A-A.

FIG. 4A is a schematic diagram illustrating the lower surface of the nitride semiconductor light emitting device in the third embodiment, and FIG. 4B is a schematic cross-sectional view of FIG. 4A taken along section A-A.

Here, the transparent electroconductive film 43 is located on all or nearly all, of the entire surface 10e of the second layer 10. The laminate 16 has a circumferential recessed or inset portion 16n about the outer perimeter thereof extending from the surface of the first layer 14 and terminating within the second layer 10. For an inset depth DS of 20 µm for the recessed portion 16n inset into the outer perimeter of the first layer 14 and a similar inset into portion 16m formed by the same etching operation, for example, the inset dimension of one edge length L1 is 460 µm and the other edge length L2 is 460 µm in the laminate 16.

The light shielding layer 36 suppresses light leakage outwardly of the LED through the side surface (light Gs) particularly of the emitted light from the region adjacent o the perimeter of the laminate 16. As a result, it is possible to further suppress the color unevenness at the chip peripheral portion. Here, the light shielding layer 36 may be a light absorptive layer made of a black resin or the like, or a light reflective layer containing metal or the like.

Figure 5A:
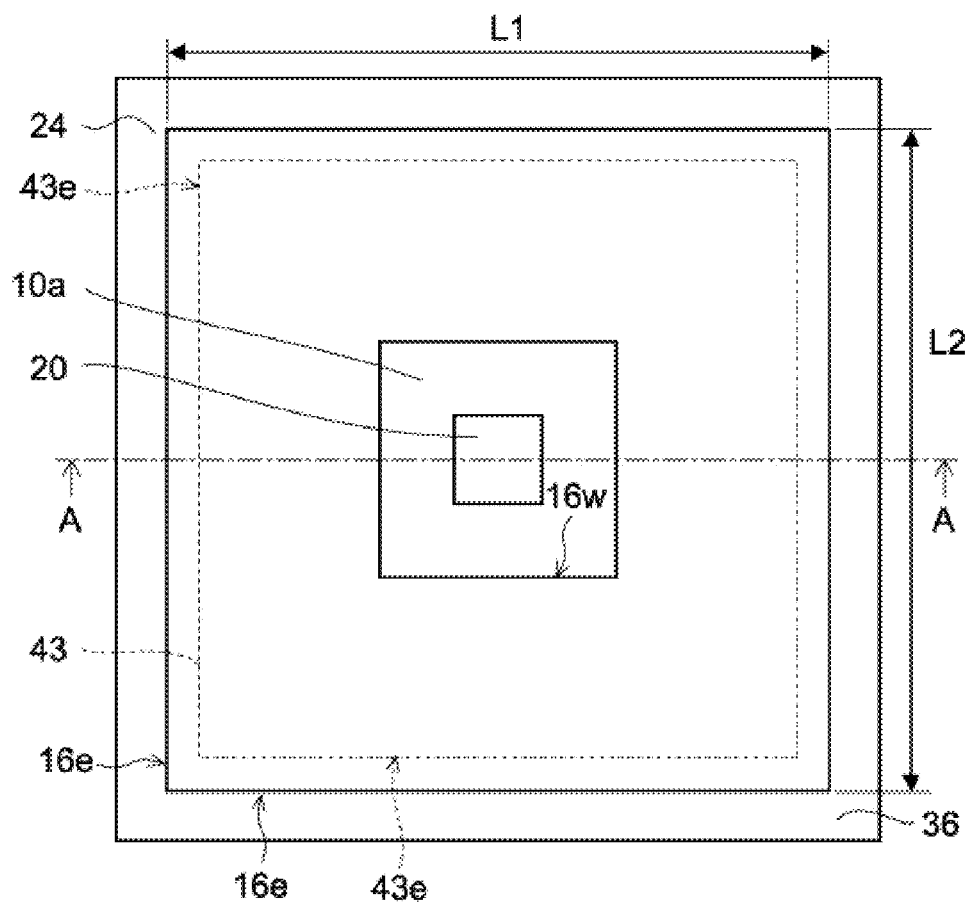
FIG. 5A is a schematic diagram illustrating the lower surface of a nitride semiconductor light emitting device in a fourth embodiment.
Figure 5B:
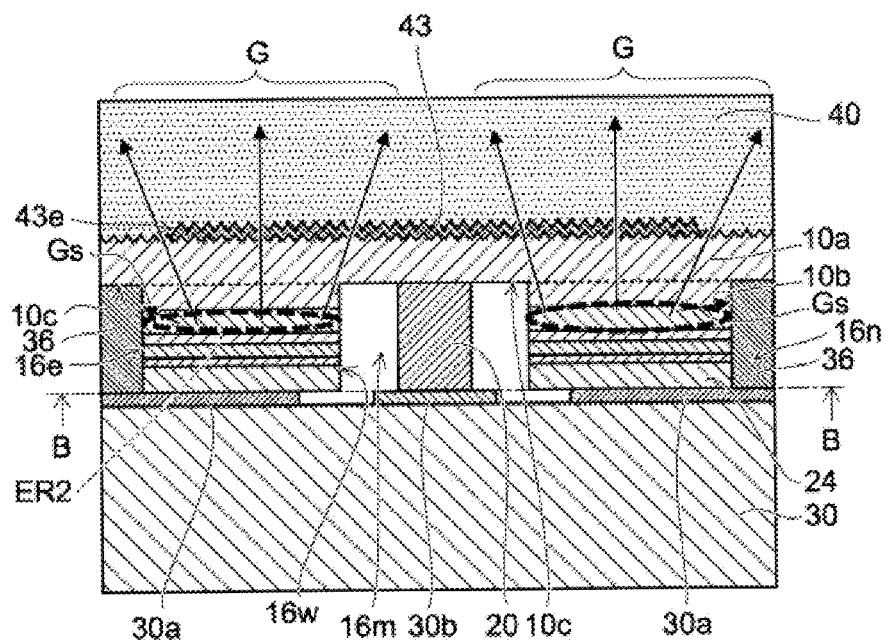
FIG. 5B is a schematic cross-sectional view of FIG. 5A taken along A-A.

FIG. 5A is a schematic diagram illustrating the lower surface of the nitride semiconductor light emitting device in the fourth embodiment, and FIG. 5B is a schematic cross-sectional view of FIG. 5A taken along section A-A.

In this embodiment, the inset structure of FIGS. 4A and 4B is further modified with the modification to the extent of the conductive layer 42 shown in FIGS. 2A and 2B. Here, as the transparent electroconductive film 43 terminates at side 43a which is inwardly of the largest width extent of the laminate 16 at perimeter 16e, the light emitting region ER2 occurs inwardly of the position of the perimeter of the laminate of FIG. 2B, and it is possible to decrease the quantity of light leaking or emitted from the perimeter as light Gs. As a result, it is possible to further suppress the color unevenness at the peripheral portion of the chip.

Figure 6:
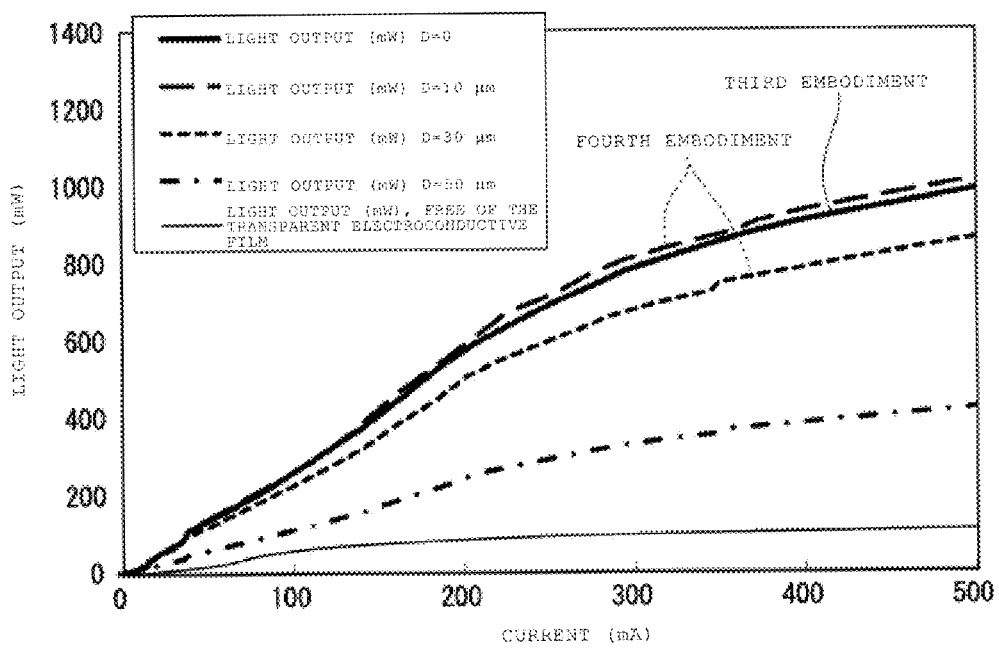
FIG. 6 is a graph illustrating the results of simulation for dependence property of light output to a distance between an outer perimeter of a transparent electroconductive film and an outer perimeter of the laminate.

FIG. 6 is a graph illustrating the results of a simulation of the dependence of the light output to the distance between the side surface of the transparent electroconductive film and the side surface of the laminate at the full or largest perimeter portion of the laminate 16.

Here, the ordinate represents the light output (mW), and the abscissa represents the current (mA).

In the comparative example where the transparent electroconductive film is not provided between n-type GaN clad layer 10a and phosphor layer 40, even when the current is as high as 500 mA, the light output is still as low as about 100 mW. On the other hand, according to the third embodiment shown in FIG. 3B, when the current is 500 mA, the light output is about 980 mW. In the fourth embodiment, when the distance D is 10 µm, the light output is about 1000 mW, and, when the distance D is 30 µm, the light output is about 850 mW. As the distance D is 50 µm or larger, the current is concentrated at the central portion of the laminate 16, and the carrier overflow and the Auger recombination effect increases. As a result, the light emitting efficiency of the LED decreases, and the light output also becomes lower. That is, in order to increase the light output, it is preferred that the distance D from which the end 43a of the transparent conductive layer 43 is spaced from the edge of the device, or inset from the outermost extent of the light emitting layer 12, be smaller than 50 µm, or more preferably smaller than 30 µm.

Even when the light shielding layer 36 is provided, in order to suppress the color unevenness at the peripheral portion of the device, the distance D is preferably larger than zero, or more preferably 10 μm or larger.

The electrons are injected from the second electrode 20 into the second layer 10, and they are spread by the transparent electroconductive film 43 arranged on the surface 10e of the second layer 10 and are then injected into the light emitting layer 12. On the other hand, as the first electrode 24 is arranged substantially over the width of the surface of the first layer 14, the holes are more evenly spread out and fed to the light emitting layer 12. As a result, the carriers are spread over a wide portion of the light emitting layer 12, and the spontaneous light emitting recombination takes place. As a result, even with a high current, the carrier density in the light emitting layer 12 is still not so high as to cause significant Auger combination at a higher current than would occur in a conventional device of the same dimension, and it is possible to suppress the overflow and the Auger recombination, and it is thus possible to increase the light output and the light emitting efficiency of the device.

In this way, by arranging the location and extent of the transparent electroconductive film 43, it is easy to spread the electrons injected from the second electrode 20, so that the n-type GaN clad layer 10a in the second layer 10 can be made as thin as, e.g., 2 μm.

If the transparent electroconductive film 43 is not provided, the electrons flow into the region of the light emitting layer 12 near the second electrode 20, a high electron density occurs, so that the Auger recombination effect and the carrier overflow readily occur, and the light emitting efficiency and the light output decrease. As a result, the light output at a current of 500 mA decreases is about 110 mW or lower.

Figure 7A:
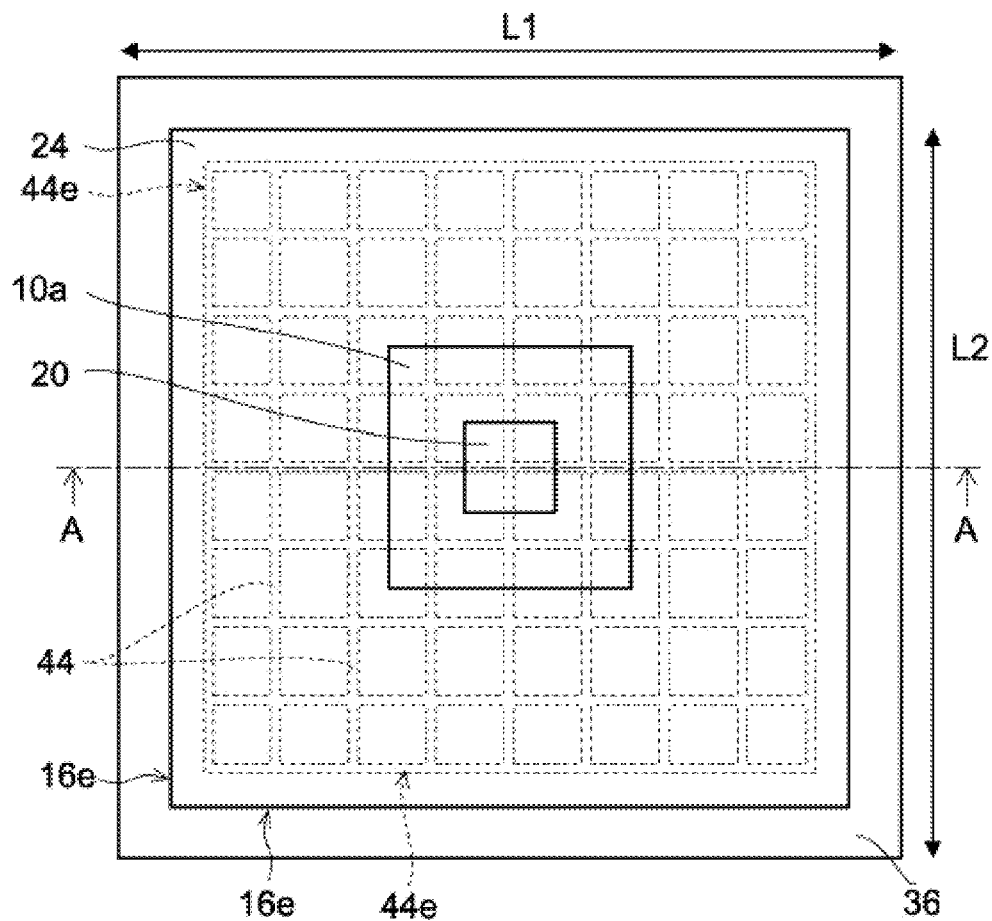
FIG. 7A is a schematic diagram illustrating the lower surface of a nitride semiconductor light emitting device in a fifth embodiment.
Figure 7B:
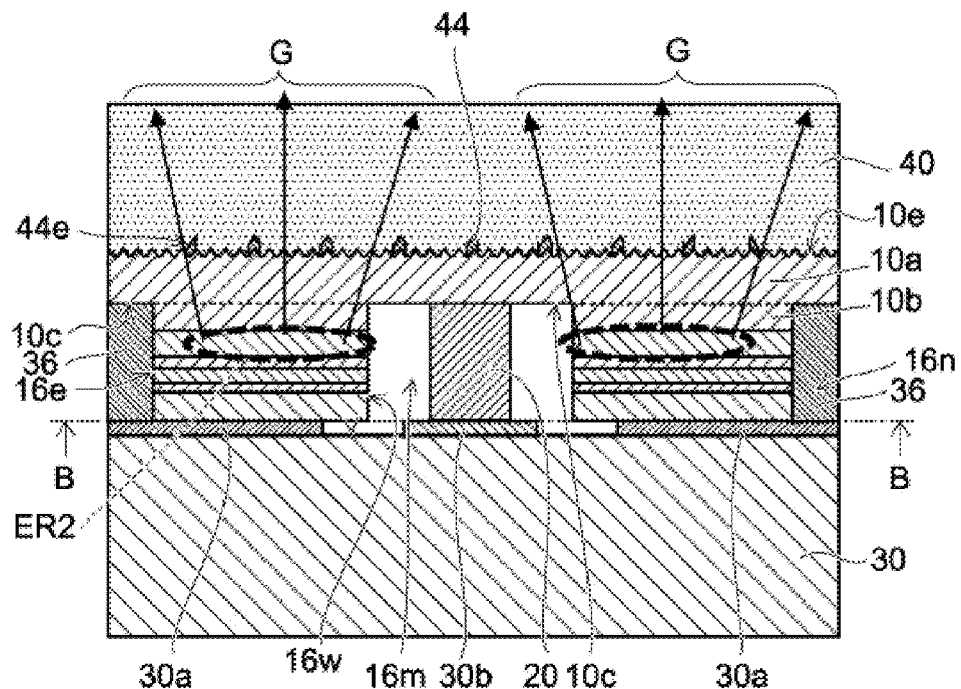
FIG. 7B is a schematic cross-sectional view of FIG. 7A taken along A-A.

FIG. 7A is a schematic diagram illustrating the lower surface of the nitride semiconductor light emitting device in the fifth embodiment, and FIG. 7B is a schematic cross-sectional view of FIG. 7A taken along section A-A.

Here, FIG. 7A is a schematic diagram illustrating the lower surface along B-B in FIG. 7B. According to the fifth embodiment, a grid shaped or mesh shaped metal layer 44 is used as the conductive layer 42, and the LED otherwise has the structure shown and described with respect to FIG. 4b or 5B. Here, the mesh-shaped metal layer 44 can enable conduction and thus spreading of the electrons injected from the second electrode 20 into the second layer 10 in the lateral direction, i.e., from the central region to the edge regions of the LED, as the electrons are fed to the light emitting layer 12 by the second electrode 20. The mesh-shaped metal layer 44 may comprise an Al/Au laminated metal layer, which may have a structure of fine wires measuring 0.5 μm in thickness and 8 μm in width arranged in grid configuration with an interval between wire centers of 50 μm. As the center of the second electrode 20 is arranged to contact the center of the grid of wires of the mesh shaped metal layer, it is possible to enable symmetry of the current distribution over the cross section of the LED device. In addition, as shown in the drawing, the outermost surface 44e, i.e., the perimeter, of the mesh-shaped metal layer 44 is positioned inwardly of the side surface 16e of the device, i.e., inwardly of the outer perimeter of the device However, one may also adopt a scheme in which the surface 10e is almost fully covered and the mesh shaped layer extends to the perimeter of the LED device.

Figure 8A:
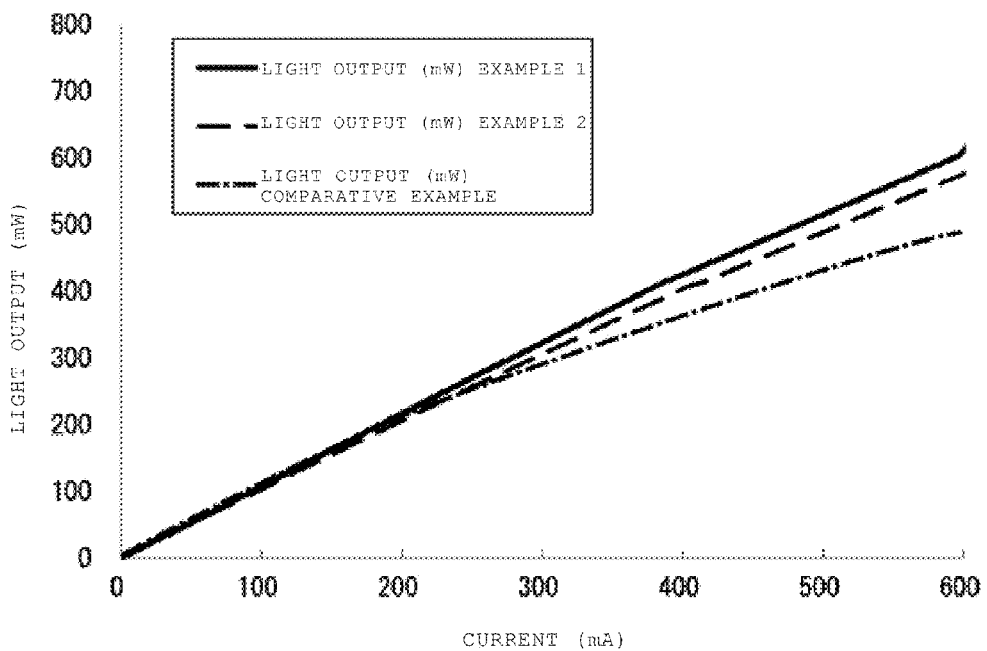
FIG. 8A is a graph illustrating the results of the simulation for dependence property of the light output to a current.
Figure 8B:
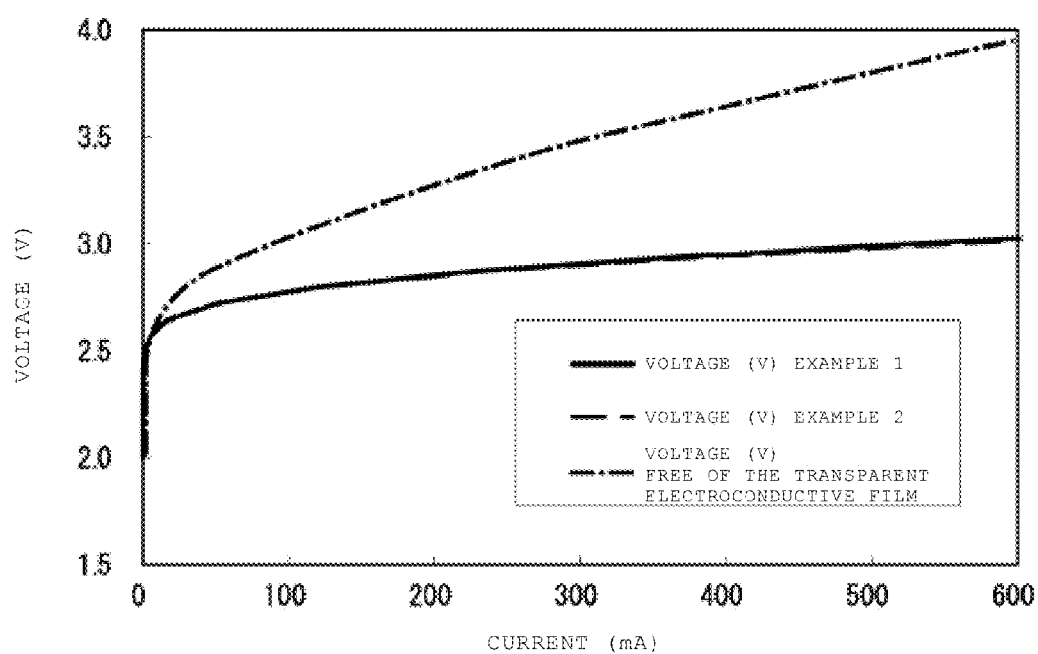
FIG. 8B is a graph illustrating the results of the simulation for dependence property of voltage to the current.

FIG. 8A is a graph illustrating the results of the simulation for the relationship between the light output and the current in the LED structure fifth embodiment, and FIG. 8B is a graph illustrating the results of the simulation for of the relationship between the voltage and the current in the LED structure of the fifth embodiment.

The solid line of FIGS. 8A and 8B corresponds to the results of Example 1 of the fifth embodiment where the thickness of the n-type GaN clad layer 10a is 4 μm, the broken (dashed) line corresponds to the results of a second example of the fifth embodiment where the thickness of the n-type GaN clad layer 10a is 2 μm, and the dot-dash line corresponds to the results of the comparative example where the mesh-shaped metal layer, nor the conductive layer 42 of the previous embodiment, is not used.

In Example 1, the light output is about 605 mW when the current is 600 mA. In Example 2, the light output is about 580 mW, only a little lower that that of Example 1, when the current is 600 mA. On the other hand, in the comparative example, the light output is as low as about 490 mW when the current is 600 mA. Consequently, it is found that the current diffusing effect of the mesh-shaped metal layer 44 is significant.

On the other hand, the voltage is 3.0 V when the current is 600 mA in both Example 1 and Example 2 of the fifth embodiment, and the current to voltage curves of Examples 1 and 2 substantially overlap on FIG. 8B. In the comparative example, the voltage exceeds 3.95 V as the current exceeds about 400 mA, yet the light emitting efficiency is as low as about 63% of that of Example 1.

Commonly, when using a nitride base material for the LED, the lattice is mismatched with respect to the sapphire, silicon, or another substrate. Consequently, it is difficult to growth a thick crystal single laminate, and the ability to repeatedly manufacture good devices, known as the manufacturing yield, suffers. Here, by reducing the thickness of the n-type GaN layer 10a to 2 μm, it is possible to grow the laminate 16 with an excellent crystallinity with a good yield.

Figure 9A:
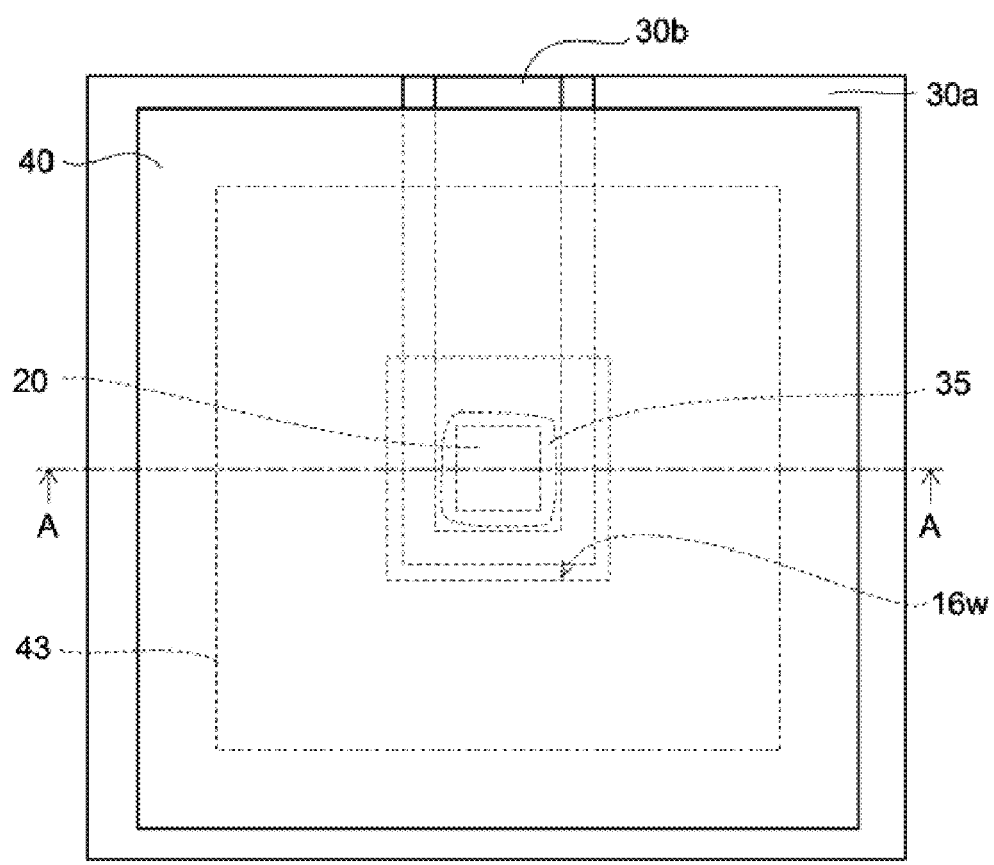
FIG. 9A is a schematic diagram illustrating the upper surface of an electrode lead-out structure.

FIGS. 9A and B and 10A and B illustrate structures for providing leads or lead ins for the electrical connection of the electrodes of the LED device to an external electrical source.

Figure 9B:
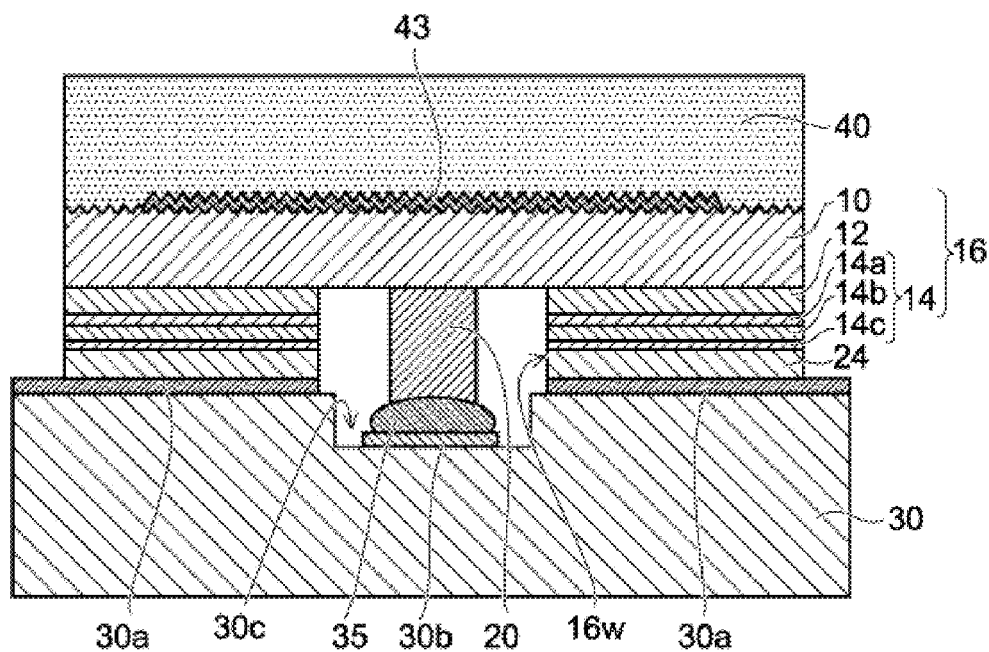
FIG. 9B is a schematic cross-sectional view of FIG. 9A taken along A-A.

FIG. 9A is a schematic diagram illustrating the upper surface of the electric wire lead-out structure, and FIG. 9B is a schematic cross-sectional view of FIG. 9A taken along section A-A.

The supporting body 30 is electrically insulating, and has a slot like recess 30c formed thereon. A third electrode 30a is formed on the top surface of the supporting body 30, and a fourth electrode 30b is formed on the base surface of the recession 30c. At least a portion of the third electrode 30a and at least a portion of the fourth electrode 30b extend outwardly beyond the perimeter of the laminate 16 and the phosphor layer 40, so that they may be contacted for use as the lead-out electrodes. Here, the fourth electrode 30b and the second electrode 20 can be interconnected reliably by means of a solder bump 35 or the like.

Figure 10A:
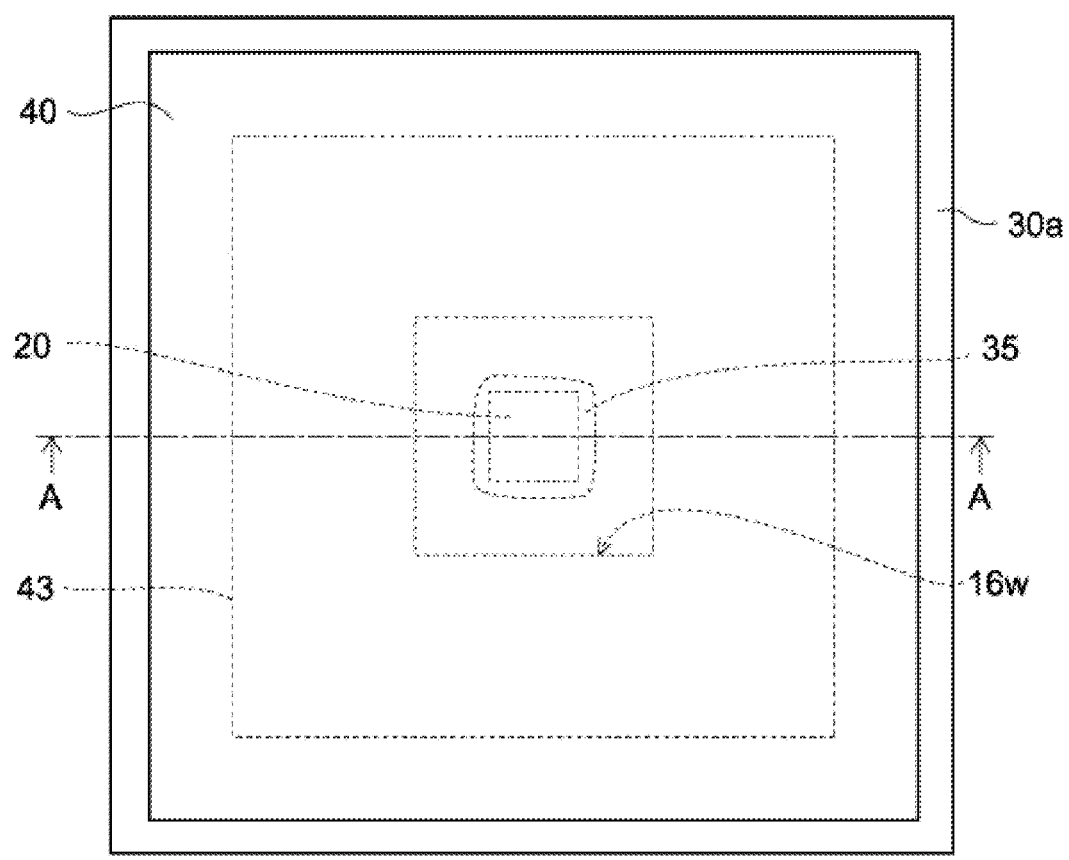
FIG. 10A is a schematic diagram illustrating the upper surface of an electrode lead-out structure in a modified example.
Figure 10B:
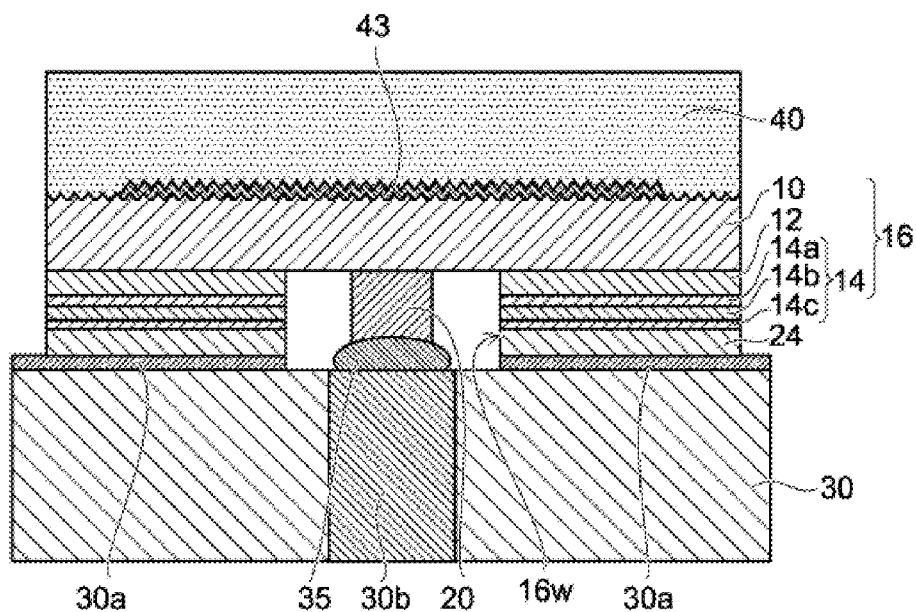
FIG. 10B is a schematic cross-sectional view of FIG. 10A taken along A-A.

FIG. 10A is a schematic diagram illustrating the upper surface of the electrode lead-out structure in a modified example, and FIG. 10B is a schematic cross-sectional view of FIG. 10A taken along section A-A.

In this embodiment, supporting body 30 has an insulating property, and a through hole is formed to extend through the central portion of the insulative supporting body 30. The third electrode 30a is arranged on the upper surface of the supporting body 30 as is described with respect to FIGS. 9A and 9B, and the fourth electrode 30b extends through, and may be formed to fill, the hole extending through the main body. At least a portion of the third electrode 30a extends outwardly of the perimeter of the laminate 16 and of the phosphor layer 40, so that it can be used together with the fourth electrode 30b extending through the hole as the lead-out electrodes. In addition, the fourth electrode 30b and the second electrode 20 can be reliably interconnected using a solder bump 35 or the like.

Figure 11A:
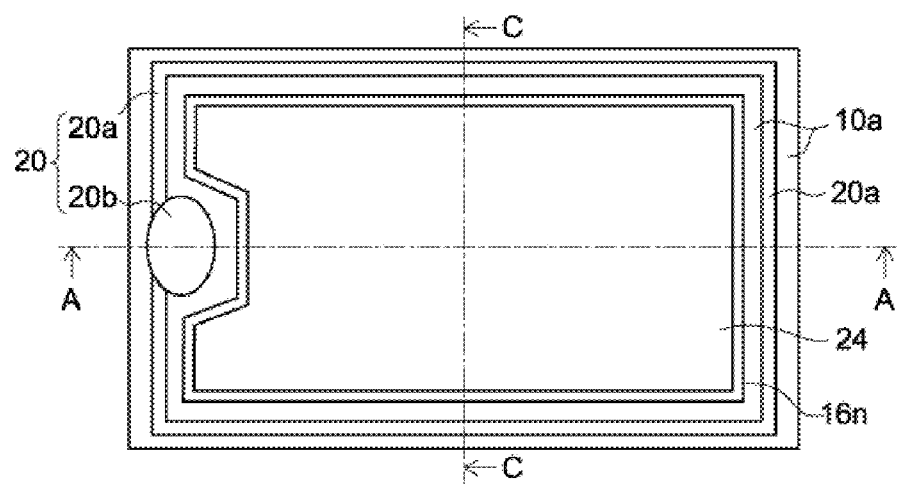
FIG. 11A is a schematic diagram illustrating the lower surface of a nitride semiconductor light emitting device in a sixth embodiment.
Figure 11B:
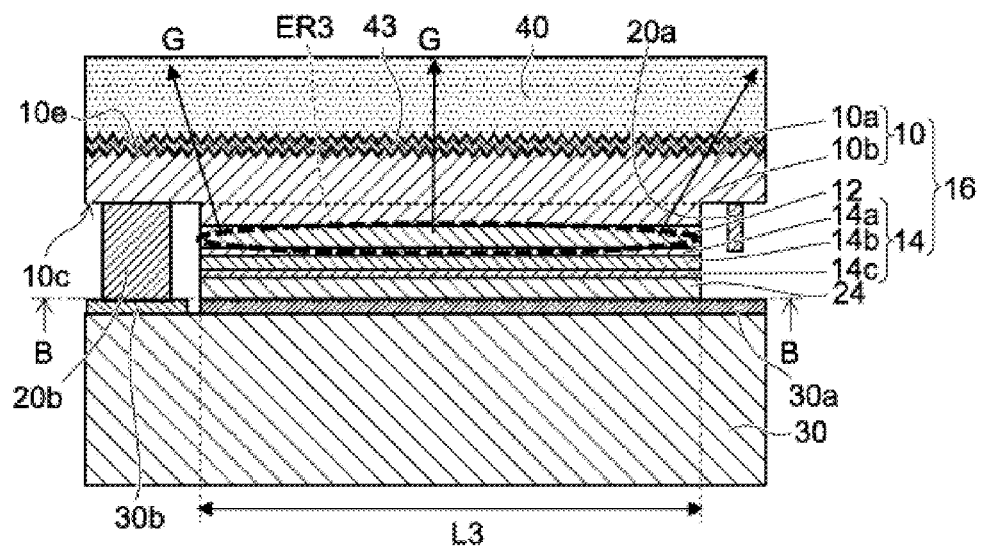
FIG. 11B is a schematic cross-sectional view taken along A-A.
Figure 11C:
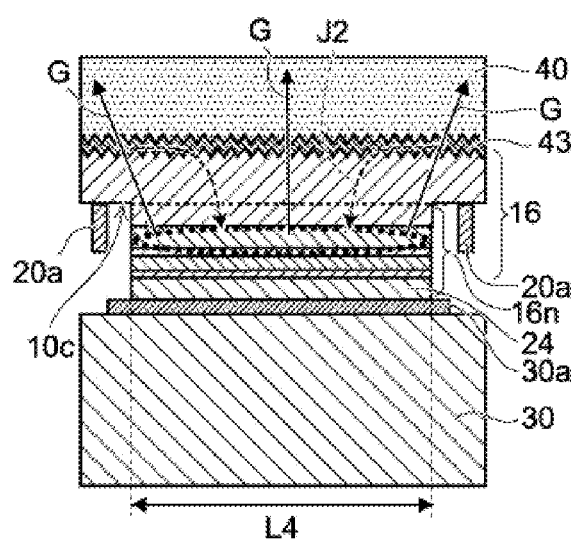
FIG. 11C is a schematic cross-sectional view of FIG. 11A taken along C-C.

FIG. 11A is a schematic diagram illustrating the lower surface of the nitride semiconductor light emitting device in a sixth embodiment hereof, and FIG. 11B is a schematic cross-sectional view of FIG. 11A taken along section A-A, and FIG. 11C is a schematic cross-sectional view of FIG. 11A taken along section C-C.

The nitride semiconductor light emitting device includes a laminate 16, a first electrode 24, a second electrode 20, a transparent electroconductive film 43 and a phosphor layer 40.

The laminate 16 includes the first layer 14 including the first electroconductive-type layer, the second layer 10 including the second electroconductive-type layer, the light emitting layer 12 arranged between the first layer 14 and the second layer 10, formed in a nitride semiconductor. The laminate 16 is faceted with a recess 16n (FIG. 11C) such that at least the first layer 14 extends from the second layer 10 in a mesa shape. The recessed portion 16n extends inwardly of the perimeter of the second layer 10 and stops on the bottom surface 10c.

The second electrode 20 includes a thin wire-like portion 20a and a pad portion 20b. The thin wire-like portion 20a is formed on, and extends in the direction of the direction of the supporting body from, the surface 10c of the recessed portion 16n. Also, the second electrode 20 is arranged around the periphery of the first layer within the recessed portion 16n extending from the bottom surface 10c of the recessed portion 16n. The pad portion 20b of the second electrode 20 is arranged on the bottom surface 10c, and it is connected to the thin wire-like portion 20a. The transparent electroconductive film 43 is arranged on substantially the entirety of the surface 10e of the second layer 10 on the side opposite to the light emitting layer 12.

The laminate 16 may have a square planar shape. In this case, even when the fine wire-like portion 20a is employed as a portion of the second electrode, in the portion of the laminate 16, near the central portion of the laminate 16, the carriers may not be well distributed. When the one side length L3 of the mesa portion of the laminate within the faceted recessed portion 16n is larger than the other side length L4 thereof (FIG. 11C), the carriers injected from the thin wire-like portion 20a are distributed to the central portion by the conductive layer 42. That is, when the laminate 16 has a large size, when L3>L4, it is possible to distribute the carriers (electrons) over the wide surface of the light emitting layer 12 due to the presence of the transparent electroconductive film 43. As a result, it is possible to maintain a low Auger recombination probability and a low carrier overflow, it is possible to suppress decreases in the light emitting efficiency of the LED at a high current, and it is possible to increase the light output of the LED.

Figure 12A:
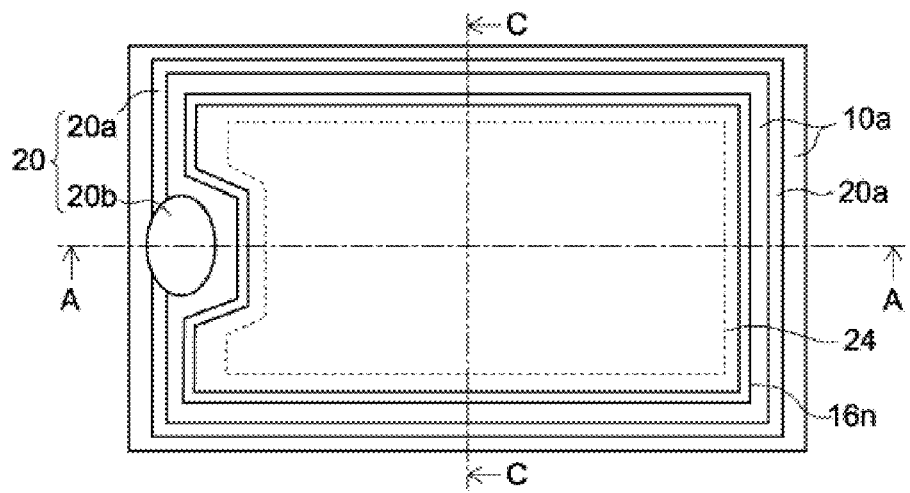
FIG. 12A is a schematic diagram illustrating the lower surface of a nitride semiconductor light emitting device in a seventh embodiment.
Figure 12B:
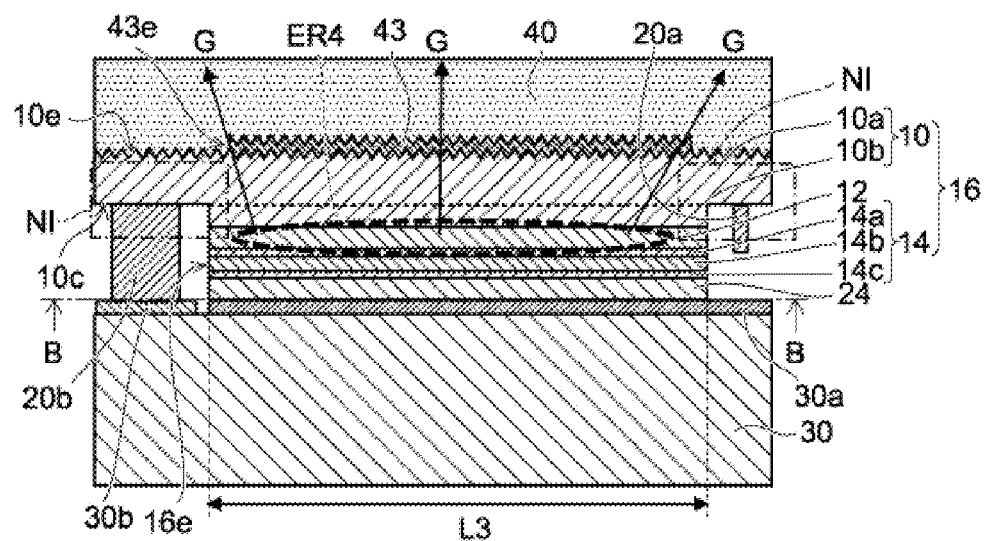
FIG. 12B is a schematic cross-sectional view taken along A-A.
Figure 12C:
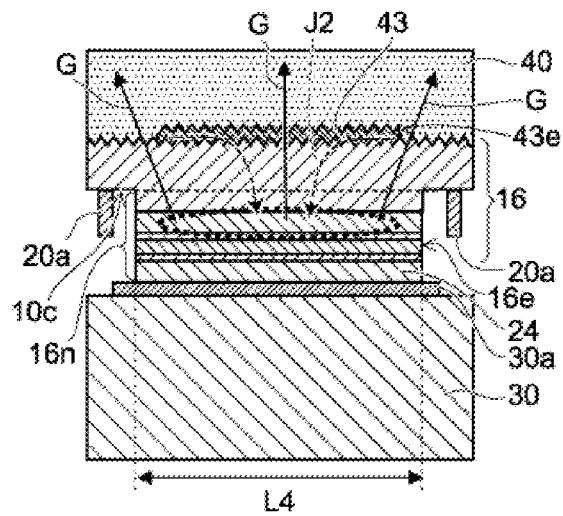
FIG. 12C is a schematic cross-sectional view of FIG. 12A taken along C-C.

FIG. 12A is a schematic diagram illustrating the lower surface of the nitride semiconductor light emitting device in the seventh embodiment, FIG. 12B is a schematic cross-sectional view of FIG. 12A taken along section A-A, and FIG. 12C is a schematic cross-sectional view of FIG. 12A taken along section C-C.

In this embodiment, the transparent electroconductive film 43 is formed on the surface 10e of the second layer 10 on the side thereof opposite to the light emitting layer 12. The side surface 43e of the transparent electroconductive film 43 terminates inwardly of the perimeter of the surface 10e of the laminate 16, and slightly inwardly of the inward extent of the recessed portion 16n of the laminate 16. Also, a patent of unevenness is formed on the surface 10e of the second layer 10, which transfers to both surfaces of the transparent electroconductive film 43, so it is possible to suppress the total reflection of the emitted light from both surfaces of the transparent electroconductive film 43, and it is possible to increase the light output efficiency.

Figure 13:
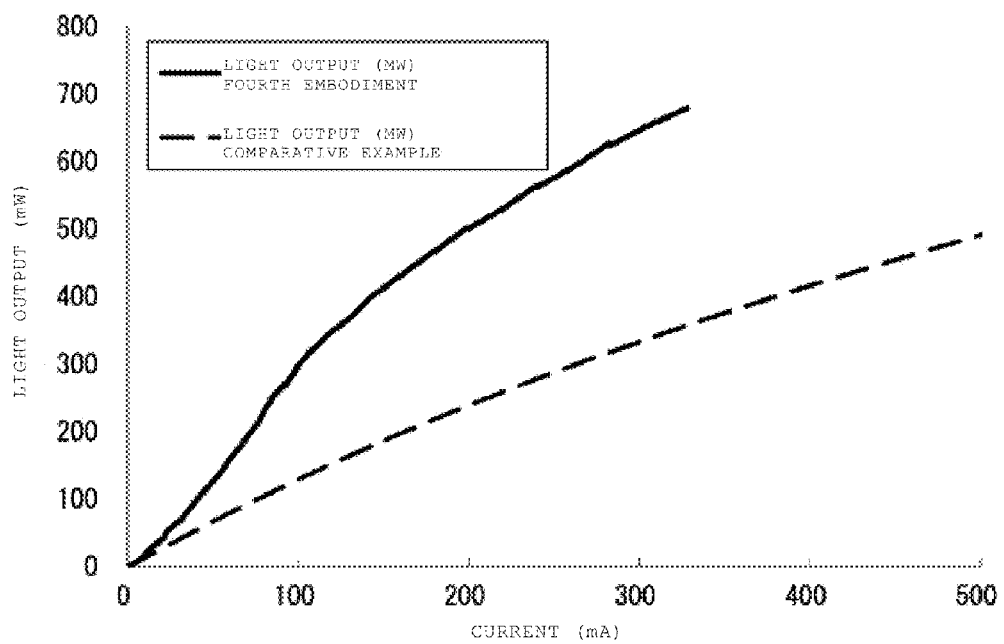
FIG. 13 is a graph illustrating the results of the simulation for dependence property of the light output to a current in the seventh embodiment.

FIG. 13 is a graph illustrating the results of the simulation for dependence property of the light output to the current in the seventh embodiment.

Here, the solid line corresponds to the seventh embodiment, where one edge length L3 is 400 µm, and the other edge length L4 is 200 µm, and the broken line corresponds to the comparative example where the sizes of L3 and L4 are the same, and the transparent electroconductive film is not provided. When the current is 300 mA, the light output in the seventh embodiment is as high as about 630 mW, while it is as low as about 220 mW in the comparative example. By having the transparent electroconductive film 43 end inwardly of the perimeter 16e of the recessed portion, it is possible to suppress the color unevenness in the peripheral portion of the chip.

According to the first through the seventh embodiments, the nitride semiconductor light emitting devices with high light emitting efficiency and a high light output are provided. According to the second, the fourth, the fifth and the seventh embodiments, it is possible to decrease the color unevenness in the peripheral portion of the chip. These nitride semiconductor light emitting devices can be adopted widely in the illuminating devices, display devices, traffic lights, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride semiconductor light emitting device, comprising:
    a multi layered nitride semiconductor including a first layer of a first conductivity type, a second layer of a second conductivity type different from the first conductivity type, and a light emitting layer between the first layer and the second layer, wherein a recess extends inwardly of the first layer and the light emitting layer;
    a first electrode contacting the first layer;
    a second electrode contacting the second layer; and
    a transparent conductive layer disposed on the second layer directly over the recess.

2. The nitride semiconductor light emitting device of claim 1, wherein the second electrode extends inwardly of the recess and contacts a first surface of the second layer.

3. The nitride semiconductor light emitting device of claim 2, wherein:
    the second layer includes a second surface opposed to the location of the recess extending thereto; and
    the transparent conductive layer is disposed on the second surface.

4. The nitride semiconductor light emitting device of claim 3, wherein the transparent conductive layer terminates inwardly of the perimeter of the second surface.

5. The nitride semiconductor light emitting device of claim 3, wherein the transparent conductive layer extends over the entire second surface.

6. The nitride semiconductor light emitting device of claim 1, further including a light blocking material disposed at an outside of the first layer and the light emitting layer.

7. The nitride semiconductor light emitting device of claim 6, wherein the light blocking material is an absorptive material or a reflective material.

8. The nitride semiconductor light emitting device of claim 3, further including a grid electrode disposed over the second surface of the second layer.

9. A nitride semiconductor light emitting device, comprising:
a nitride semiconductor laminate including a first layer including a first electroconductive-type layer, a second layer including a second electroconductive-type layer, and a light emitting layer arranged between the first layer and the second layer, the laminate including a recessed portion extending from a surface of the first layer at a side opposite to the light emitting layer to a portion of the second layer in at least one of a central portion and an outer peripheral portion of the laminate;
a first electrode arranged on the surface of the first layer;
a second electrode surrounded by the light emitting layer or on the periphery of the light emitting layer and is arranged on a bottom surface of the recessed portion;
a conductive layer arranged on a surface of the second layer at a side opposite to the light emitting layer; and
a phosphor layer covering the surface of the second layer and the conductive layer.

10. The nitride semiconductor light emitting device according to claim 9, wherein the conductive layer comprises at least one of a transparent electroconductive film and a mesh-shaped metal layer.

11. The nitride semiconductor light emitting device according to claim 9, wherein the conductive layer terminates inwardly of the perimeter of the laminate.

12. The nitride semiconductor light emitting device according to claim 11, wherein a second surface of the second layer is uneven.

13. A nitride semiconductor light emitting device, comprising:
a multi layered nitride semiconductor including a first layer of a first conductivity type, a second layer of a second conductivity type different from the first conductivity type, and a light emitting layer between the first layer and the second layer, wherein a recess extends inwardly of the first layer and the light emitting layer;
a first electrode contacting the first layer; and
a second electrode contacting the second layer and extends inwardly of the recess and contacts a first surface of the second layer, wherein:
the second layer includes a second surface opposed to the location of the recess extending thereto; and
a transparent conductive layer is disposed on the second surface directly over the recess.

14. The nitride semiconductor light emitting device of claim 13, wherein the transparent conductive layer terminates inwardly of the perimeter of the second surface.

15. The nitride semiconductor light emitting device of claim 13, wherein the transparent conductive layer extends over the entire second surface.

16. The nitride semiconductor light emitting device of claim 13, further including a light blocking material disposed at an outside of the first layer and the light emitting layer.

17. The nitride semiconductor light emitting device of claim 16, wherein the light blocking material is an absorptive material or a reflective material.

18. The nitride semiconductor light emitting device of claim 13, further including a grid electrode disposed over the second surface of the second layer.

* * * * *